US006566170B1

(12) United States Patent
Marion et al.

(10) Patent No.: US 6,566,170 B1
(45) Date of Patent: May 20, 2003

(54) METHOD FOR FORMING A DEVICE HAVING A CAVITY WITH CONTROLLED ATMOSPHERE

(75) Inventors: François Marion, St Egreve (FR); Jean-Louis Pornin, Crolles (FR); Claude Massit, St Isnier (FR); Patrice Caillat, Echiolles (FR)

(73) Assignee: Commissariat a l'Energie Atomique (FR)

( * ) Notice: Subject to any disclaimer, the term of this patent is extended or adjusted under 35 U.S.C. 154(b) by 0 days.

(21) Appl. No.: 09/701,435

(22) PCT Filed: Jun. 17, 1999

(86) PCT No.: PCT/FR99/01457

§ 371 (c)(1),
(2), (4) Date: Dec. 18, 2000

(87) PCT Pub. No.: WO99/67818

PCT Pub. Date: Dec. 29, 1999

(30) Foreign Application Priority Data

Jun. 22, 1998 (FR) .............................. 98 07841

(51) Int. Cl.$^7$ ................................................ H01L 21/48
(52) U.S. Cl. ................... 438/126; 438/127; 438/125
(58) Field of Search ....................... 257/704, 710, 257/779; 438/115, 116, 125, 612, 126, 127, 619, 613, 108, 112

(56) References Cited

U.S. PATENT DOCUMENTS

| 3,591,839 A | * | 7/1971 | Evans ........................ 257/684 |
| 3,657,610 A | | 4/1972 | Yamamoto et al. |
| 5,168,344 A | * | 12/1992 | Ehlert et al. ................ 257/704 |
| 5,559,373 A | * | 9/1996 | Applebaum ................. 257/710 |
| 6,278,184 B1 | * | 8/2001 | Brofman et al. ............ 257/779 |

FOREIGN PATENT DOCUMENTS

| DE | 4323799 | 1/1994 |
| EP | 0203589 | 12/1986 |
| WO | WO94/28581 | 12/1994 |

OTHER PUBLICATIONS

Masayoshi Esashi, et al., "Packaged Micromechanical Set," *1994 IEEE Symposium on Emerging Technologies & Factory Automation*, p. 30.

L. Ristic, "Sensor Technology and Device," *Artech House*, p. 207.

R. Tummala, "Microelectronic Packaging Handbook," *Van Nostrand Reinhold*, p. 736.

* cited by examiner

Primary Examiner—Steven Loke
Assistant Examiner—Douglas W. Owens
(74) Attorney, Agent, or Firm—Thelen Reid & Priest LLP; Robert E. Krebs

(57) ABSTRACT

Device comprising a carrier (100) and at least one cover (104) able to be bonded to the carrier to form with the carrier at least one cavity (114) having a controlled atmosphere around at least one component (102). In accordance with the invention, at least one of either the cover or the carrier is provided with at least one wedge (110) in fusible material and a strip of insulation (112) formed around said component, and before bonding, the wedge of fusible material is of sufficient thickness to prevent the strip of insulation (112) from coming into contact both with the cover and with the carrier when they are assembled together.

Particular application to the encapsulation of electronic, mechanical or electromagnetic components.

9 Claims, 6 Drawing Sheets

METHOD FOR FORMING A DEVICE HAVING A CAVITY WITH CONTROLLED ATMOSPHERE

"This application is a national phase of PCT/FR99/01457 which was filed on Jun. 17, 1999 and was not published in English."

TECHNICAL FIELD

The present invention relates to a method for encapsulating components and for forming a device having one or more components arranged in one or more cavities with a controlled atmosphere.

By cavity, with controlled atmosphere is meant both a cavity in which a vacuum has been set up and a cavity containing a gas with controlled composition and/or pressure.

Said cavity, defined for example by a cover applied to a substrate, can be used to house sensitive components such as electronic, electro-optic or micro-mechanical components.

In particular, the invention finds applications in the hermetic encapsulation of electronic chips, of pressure or acceleration sensors, or further of electromagnetic sensors such as bolometer sensors.

STATE OF THE PRIOR ART

Different techniques are known with which it is possible to bond a cover onto a carrier. For example glass bonding techniques may be cited, or metal-on-metal type bonding, or further anode bonding. In respect of these techniques, well known in themselves, reference may be made to documents (1), (2) and (3) whose references are given at the end of this description.

The bonding of a cover onto a carrier to form a controlled atmosphere cavity is described with reference to FIGS. 1 to 4.

A first operation, illustrated in FIG. 1, consists of positioning a cover 10 on a carrier 12, such as a substrate, in a region containing a component 14.

It is observed that cover 10 has a recess 16 oriented in the direction of the carrier 12 and intended to house the component 14. Recess 16 is surrounded by a border 18.

A strip of insulation 20, in a suitable material such as a fusible material is provided on the surface of carrier 12, so as to surround component 14 and to correspond with the shape of the border 18 in cover 10.

The mutual positioning of cover 10 and carrier 12 is made by alignment means shown very schematically and denoted 22. With these means it is possible to cause the recess 16 of the cover to coincide with the component 14 and to position the border 18 facing the strip of insulation 20.

FIG. 1 shows that all parts to be assembled, and the alignment means, are placed in a chamber 24 in which the desired controlled atmosphere is set up.

The actual bonding step, carried out after positioning of the cover, is illustrated in FIG. 2.

As shown by an arrow, cover 10 is applied to the carrier in such manner that the strip of insulation connects the border 18 in impervious manner to the upper surface of substrate 12.

Optionally, if the strip of insulation is in a fusible material, the carrier and cover assembly may be brought to sufficient temperature to cause the fusible material to melt.

Heating of the cover and carrier, which always takes place in the chamber 24 having a controlled atmosphere, is conducted for example by means of a heating plate 28 on which carrier 12 rests.

FIG. 3 shows, by way of example, a carrier 12 to which three covers 10a, 10b and 10c have been applied.

Reference 10a designates a first cover already bonded to carrier 12. Reference 10b designates a second cover being applied to carrier 12, during the bonding phase.

Finally, a third cover 10c, not yet applied to the carrier, is positioned above a component 14.

It will be noticed that the positioning of the covers and their bonding takes place successively. Also as in the example in FIG. 1, the cover alignment means 22, even though voluminous and cumbersome, must be housed in the chamber 24 with a controlled atmosphere.

The method described with reference to FIG. 3 therefore raises housing problems of the alignment means, and proves to be little adapted to the positioning of a high number of covers onto a carrier.

It is to pointed out that it is not possible with the equipment in FIG. 3 to align and deposit on the carrier all the covers outside chamber 24, and then to conduct the bonding or soldering operation in a controlled atmosphere. For when the cover is placed on the carrier previous to placing the assembly formed by the cover and carrier in a chamber in which a controlled atmosphere is set up, the passage of gas between the cover and the carrier is hindered and it is no longer possible to control precisely the atmosphere which is set up in the cavity formed by the cover and the carrier. This is especially the case when a vacuum is to be set up in the cavity.

One partial solution to the problems mentioned above is provided by a cover transfer system illustrated in FIG. 4.

This system uses an intermediate support part 26 on which covers 10a, 10b, 10c are transferred via their surface which does not come into contact with the final carrier 12.

The intermediate part 26, comprising the covers, is inserted with carrier 12 in a chamber with a controlled atmosphere, and the bonding or sealing of the covers can be conducted collectively.

The method in FIG. 4 nevertheless requires alignment means 22 for the intermediate part 24 with the carrier. Also, the intermediate part must be removed after the covers have been applied.

Another partial solution to the problem of encapsulating a plurality of components, consists of only applying to the carrier a single cover, that is sufficiently large to cover all the components and then to cut the cover individually around each component. This solution, which is not shown in the figures, requires special forming of the carrier and/or cover to form individual cavities around the components, and has recourse to delicate cutting operations.

DESCRIPTION OF THE INVENTION

The purpose of the present invention is to put forward a method for encapsulating one or more components, which does not have the difficulties or constraints described above.

The method is intended to encapsulate components which may either be previously applied to a substrate or directly integrated into the substrate (electronic chips, integrated sensors . . . ).

One purpose of the invention in particular is to provide such a method which may be conducted in a chamber with a controlled atmosphere free of means to align the covers on the components.

A further purpose is to provide such a method with which it is possible to align with precision and to bond collectively a great number of covers over corresponding components.

To attain these purposes, the subject of the invention is more precisely an encapsulation method in a controlled atmosphere of at least one component by bonding at least one cover onto at least one region of a carrier containing the component. In accordance with the method of the invention:

- at least one of either the cover or the carrier is provided with bonding means surrounding a region corresponding to said component, and with at least one wedge in a fusible material,
- the cover and substrate are mutually positioned so that the cover is arranged substantially opposite a region corresponding to the component,
- the assembly formed by the cover and carrier is heated in a chamber with a controlled atmosphere at sufficient temperature to cause the wedge of fusible material to melt.

Also the wedge in fusible material is made with sufficient initial height before fusion to prevent the bonding means from joining the cover to the carrier in impervious manner, and such as to have a height after fusion that is sufficiently low to enable impervious contact of the bonding means both with the cover and with the carrier.

By means of the wedges in fusible material, it is possible to put in place and position the covers on the carrier before inserting the carrier in the controlled atmosphere chamber.

Indeed, the wedges prevent the space between the cover and the carrier from forming a closed, isolated cavity before final bonding. The controlled atmosphere, such as a vacuum for example, may therefore be set up around the component.

Advantage may also be taken of the wedges to serve as electric connections between the carrier and the cover, for example for the transmission of electric signals.

Also, through the method of the invention, the mutual positioning of the cover and carrier, which may be conducted in an ambient atmosphere, is not critical. Since the final, exact positioning of the cover may be obtained automatically through surface tension forces exerting themselves in the fusible material when it is melted.

The method of the invention may be used for a single cover, but proves to be particularly advantageous when a large number of covers must be applied to one same substrate.

According to one particular embodiment of the method, the bonding means may comprise a strip of fusible material able to melt when heated.

The fusible material of the strip is preferably the same material as that of the wedges or a material having a melting point close to that of the wedges.

By way of example, materials such as AuSn, SnPb or CuSn may be chosen. These materials permit hybridisation with no flow of the cover on the carrier.

Therefore, when the cover and carrier are heated, the fusible material melts and forms a sealed joint between the cover and the carrier.

According to one variant, the bonding means may also comprise a strip in another material such as a screen printed glue strip.

Should the bonding means comprise a strip of fusible material, this strip may be designed such as to have an initial height before melting that is less than the initial height of the wedges of fusible material, and a height after melting—called hybridisation height—that is greater than the hybridisation height of the wedges.

Such method of proceeding is particularly adapted when the strip and the wedges are arranged in one same plane between the surfaces opposite the cover and the carrier.

By hybridisation height of an element in fusible material is meant the height that this element would have between the cover and the carrier after being melted and in the absence of outside stresses. Therefore, the hybridisation height of the wedges is determined independently from that of the strip and reciprocally.

The hybridisation height of the wedges or of the strip is dependent upon the quantity of fusible material used to produce these elements and on the adhesion surface of these elements to the cover and carrier.

In this respect, it is possible to provide the cover and the carrier with receiver areas for the fusible material that are in a material that is wettable by the fusible material.

The surfaces of the receiver areas may be adjusted in relation to a desired hybridisation height.

The invention also concerns a device comprising a carrier and at least one cover able to be bonded to the carrier to form with the carrier at least one cavity with a controlled atmosphere around at least one component. According to the invention, at least one of the covers or carriers is provided with wedges of fusible material and an insulation strip formed around the component. Also, before bonding, the wedges of fusible material are of sufficient thickness to prevent the insulation strip from coming into contact both with the cover and with the carrier when they are assembled.

Other characteristics and advantages of the present invention will become clearer on reading the following description with reference to the figures of the appended drawings. This description is given solely for illustrative purposes and is non restrictive.

SHORT DESCRIPTION OF THE FIGURES

FIGS. 1 and 2, already described, are simplified cross-section diagrams of a substrate and a cover, illustrating the successive steps of a known method for encapsulating a component.

FIG. 3, already described, is a simplified cross-section diagram of a substrate and of covers, illustrating one embodiment of the method of encapsulation applied to several components of the substrate.

FIG. 4, already described, is a cross-section diagram of a substrate and of an intermediate support part illustrating a known improvement of the encapsulation method.

Figure 11A:
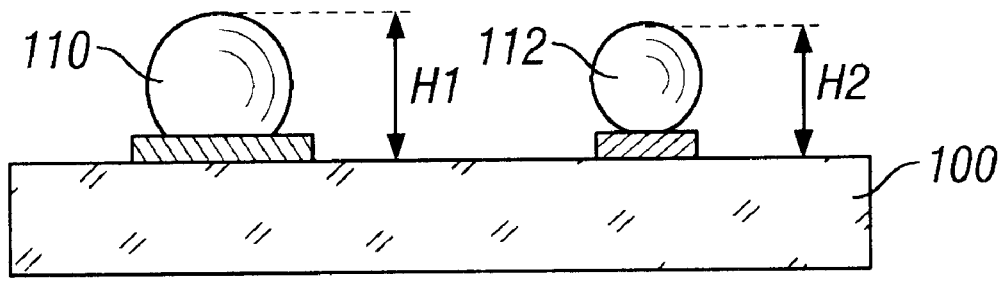
Figure 11B:
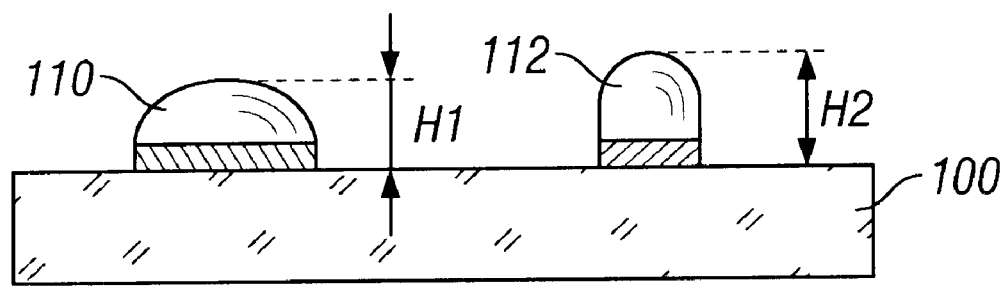

FIGS. 11-A and 11-B are simplified cross-section diagrams, illustrating the definition of the hybridization height.

DETAILED DESCRIPTION OF THE EMBODIMENT OF THE INVENTION

Figure 1:
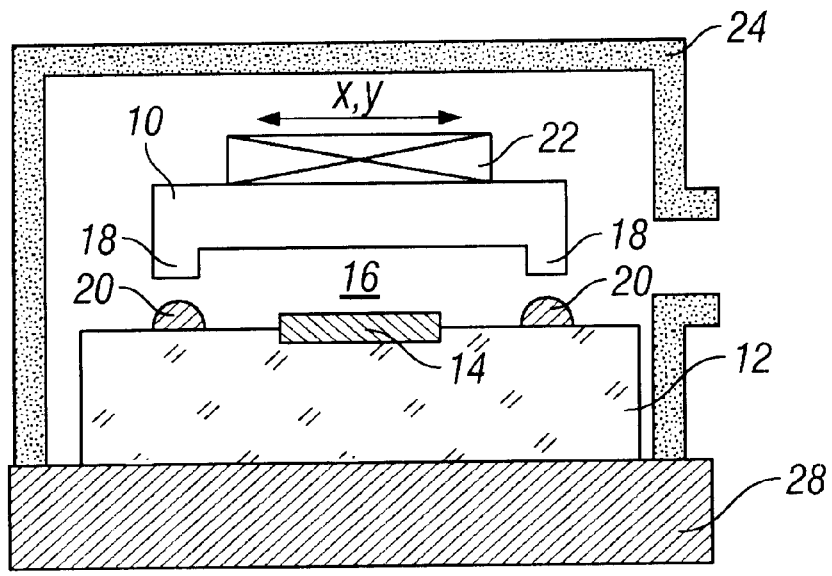
Figure 2:
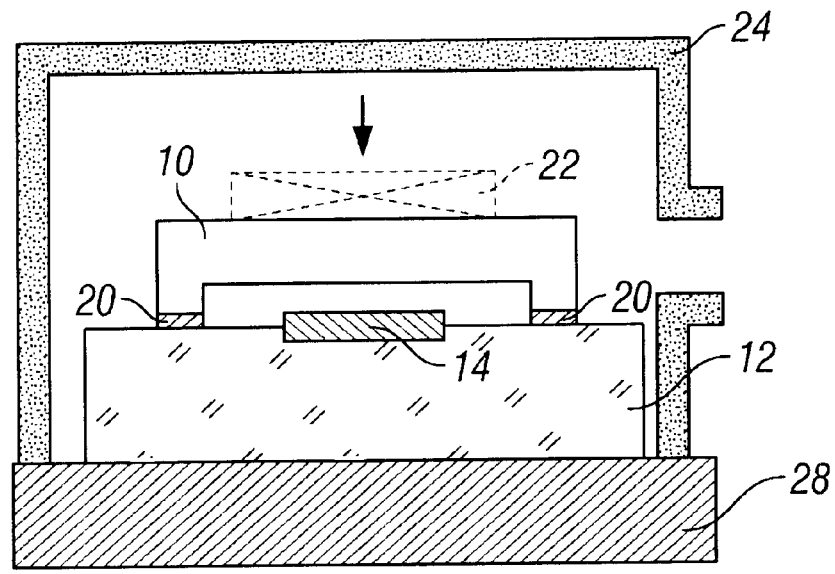
Figure 3:
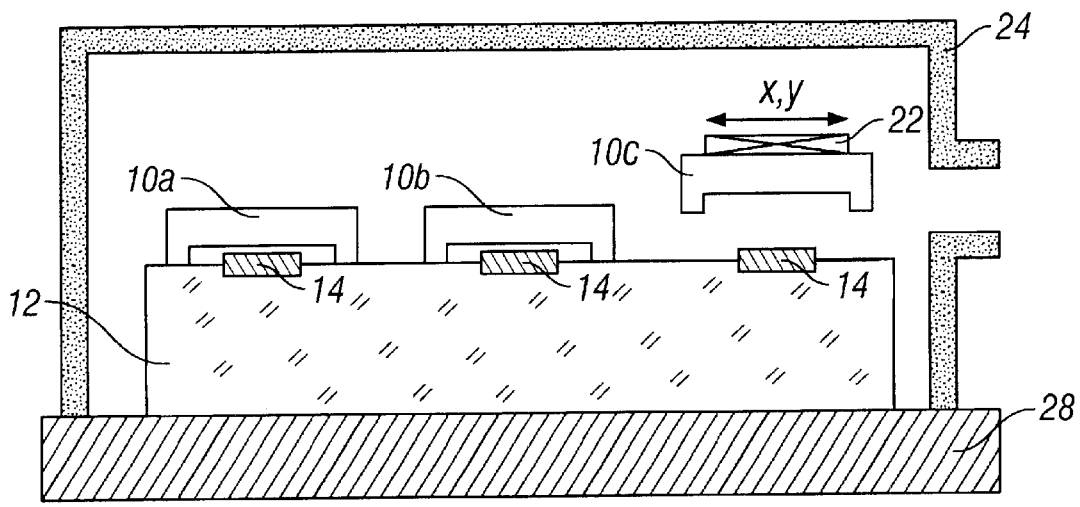
Figure 4:
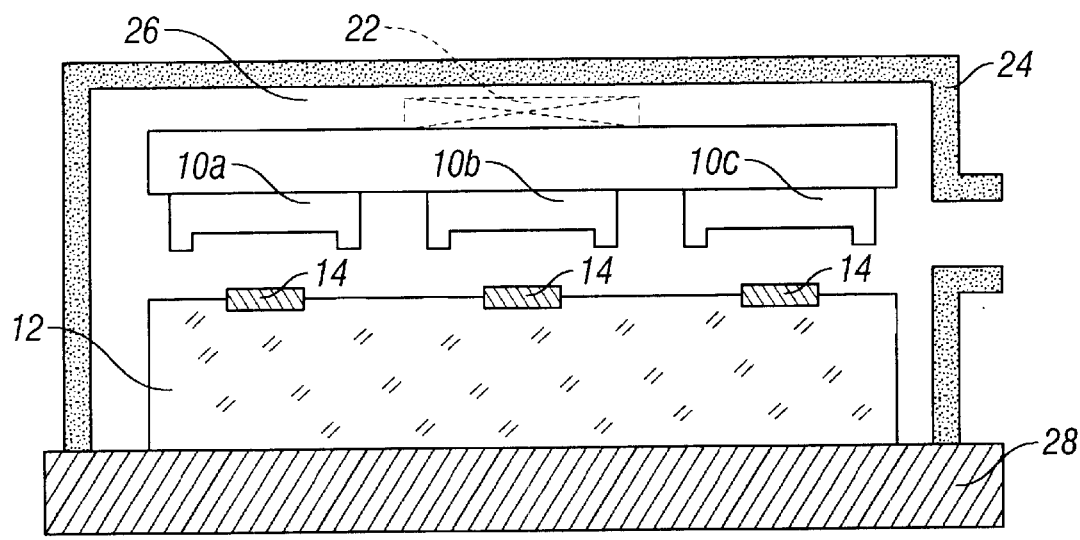
Figure 5:
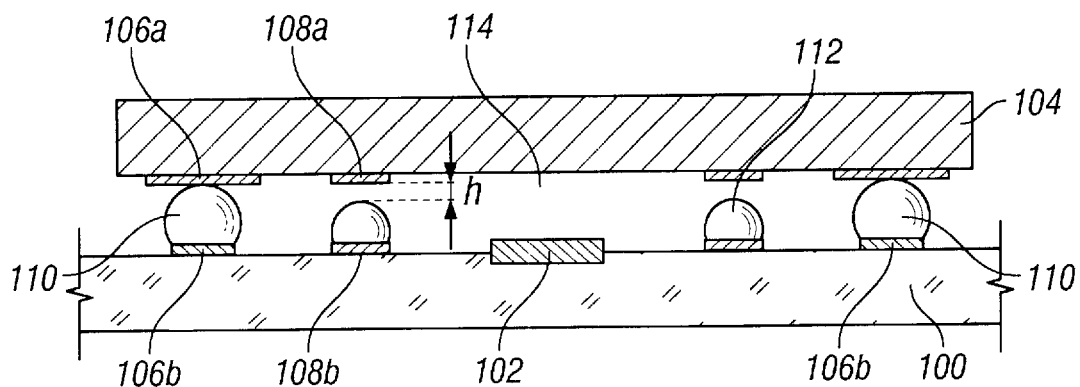
FIG. 5 is a simplified cross-section diagram of a carrier substrate and a cover illustrating the device and the method of encapsulation of the invention.

Reference 100 in FIG. 5 shows a carrier substrate, such as for example a wafer of semiconductor material, on which a component 102 is fabricated.

Component 102 may be an electronic circuit, a micromechanical sensor, such as an accelerometer, or further the sensitive element of a bolometer for example.

A cover 104 is intended to protect component 102 from outside attack and to maintain the component in a controlled atmosphere.

In FIG. 5, cover 104 is shown in a state in which it is applied to carrier 100 in such manner that it covers component 102, but in which it is not yet bonded to the carrier.

The cover is provided with areas 106a, 108a whose surface is in a material that is wettable by a fusible material, and said areas correspond to similar areas 106b, 108b of the carrier. Areas 106a, 106b, 108a, 108b are for example formed by photolithography in a stack of thin layers of titanium-nickel-gold type.

Areas 106b of the carrier are, for example, in the form of discs and are intended to receive the beads of fusible material 110. Areas 106b have for example a diameter of 80 $\mu$m to receive beads having a diameter of 140 $\mu$m.

Area 108b of the carrier is in the form of a band which forms a frame around the zone containing component 102. This band is intended to receive a strip 112 of fusible material. The band has a width of 40 $\mu$m for example to receive a strip having a cross width of 50 $\mu$m.

Figure 6:
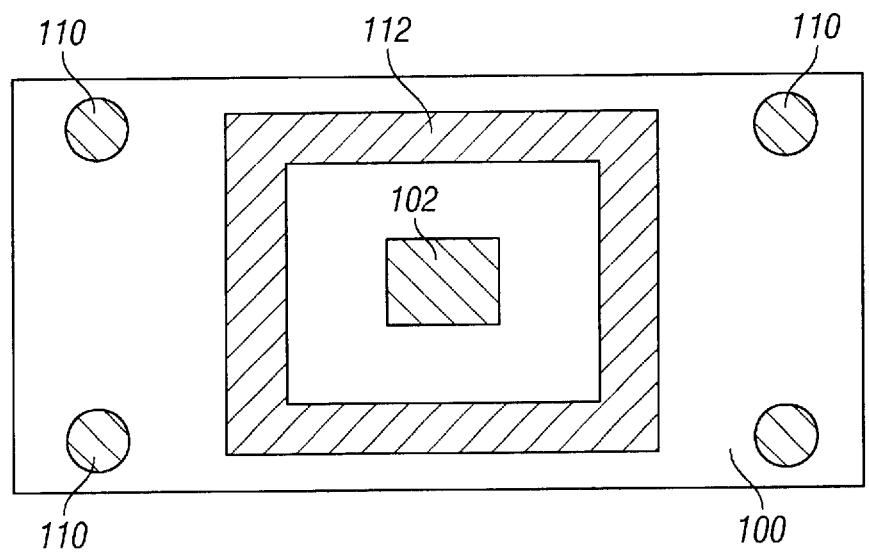
FIG. 6 is a simplified diagram of an upper surface of the carrier substrate oriented towards the cover.

The shape of the areas of wettable material 106b, 108b of carrier 100 is also visible in FIG. 6 which shows an upper surface of the carrier oriented towards the cover.

Wettable areas 106a and 108a of the cover are of similar shape and can be substantially superimposed over corresponding areas 106b and 108b of the carrier. It is observed however that the diameter of the discs forming areas 106a of the cover is greater than that of the discs forming areas 106b of the carrier. The role of the greater diameter of the cover discs is explained below.

In the example of the figure, the beads of fusible material 110 and the strip 112 are placed on the carrier. The fusible material may be a deposit of AuSn solder formed through a mask; not shown, using a screen printing, evaporation or electrolytic growth technique, for example.

As a variant, the strip and/or beads of fusible material may also be initially placed on the cover. In this case, however, the diameter of the discs receiving the beads on the cover is preferably smaller than the diameter of the corresponding discs on the carrier.

FIG. 5 shows that the diameter of the beads of fusible material 110 is chosen to be sufficient to prevent the strip from coming into contact with area 108b of wettable material in the cover. The beads 110 therefore form supporting wedges for the cover.

A space denoted h is provided between the strip 112 and the cover. This space enables a controlled atmosphere to be set up in the cavity 114 defined around the component by the cover, the carrier and the strip.

By way of example, the beads and the strip may be designed to respectively have initial heights before soldering of 70 $\mu$m and 28 $\mu$m. Space h is then h=(70−28)=42 $\mu$m.

Therefore the cover may be placed in position on the carrier before the structure assembly is inserted in a chamber with a controlled atmosphere.

Figure 7:
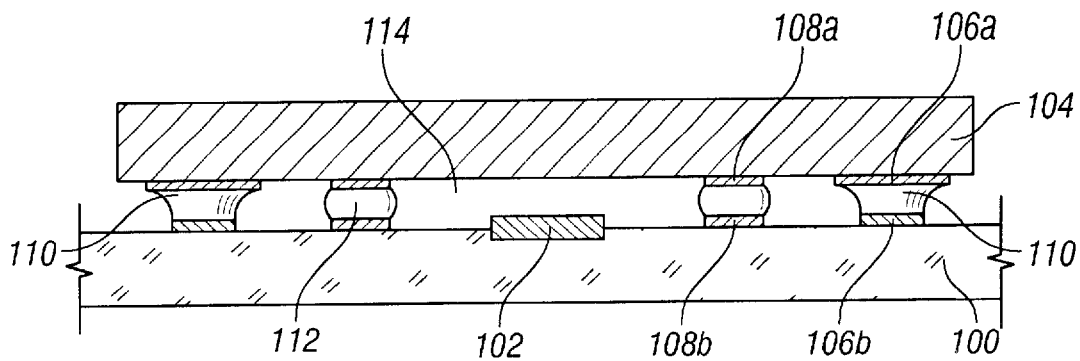
FIG. 7 is a simplified cross-section diagram of the substrate and cover in FIG. 5, after bonding.

FIG. 7 shows the state of the device after bonding of the cover onto the substrate. Bonding is made by bringing the fusible material to its melting point or higher, for example in the order of 300° C.

The melting temperature may be reduced by replacing AuSn with SnPb.

When the beads 110 melt under the effect of heat, the cover sinks and joint 112, also molten, fuses to the area of wettable material 108a of the cover. In this way, cavity 114 is sealed.

The beads 110 also fuse onto the discs forming the areas of wettable material 106a of the cover. The diameter of these discs may be chosen such that the hybridisation height of the beads 110 is less than the hybridisation height of the strip 112. Therefore, it is possible to guarantee with improved security the imperviousness of cavity 114. In the example illustrated, the diameter of the discs 106a of the cover is, for this purpose, chosen to be greater than the diameter of the discs 106b of the carrier 100.

The hybridization heights of the beads 110 and of the strip 112 have been defined hereabove, and are illustrated on FIG. 11. A wedge such as bead 110 and a bonding means such as strip 112 are placed on a carrier 100 for melting. On FIG. 11-A, showing the step before melting, the height H1 of the bead 110 is greater than the height H2 of the strip 112. On FIG. 11-B showing the step after melting, the height H1 of the bead 110 is less than the height H2 of the strip 112. These heights H1 and H2 after melting are the hybridization heights.

A surface tension effect in the molten fusible material perfects the alignment of the cover relative to the carrier. Hence, initial, quick and relatively little precise (±10 $\mu$m) positioning of the cover is allowable.

The preceding description, by way of example, concerns the application of a single cover over a single component.

Figure 10:
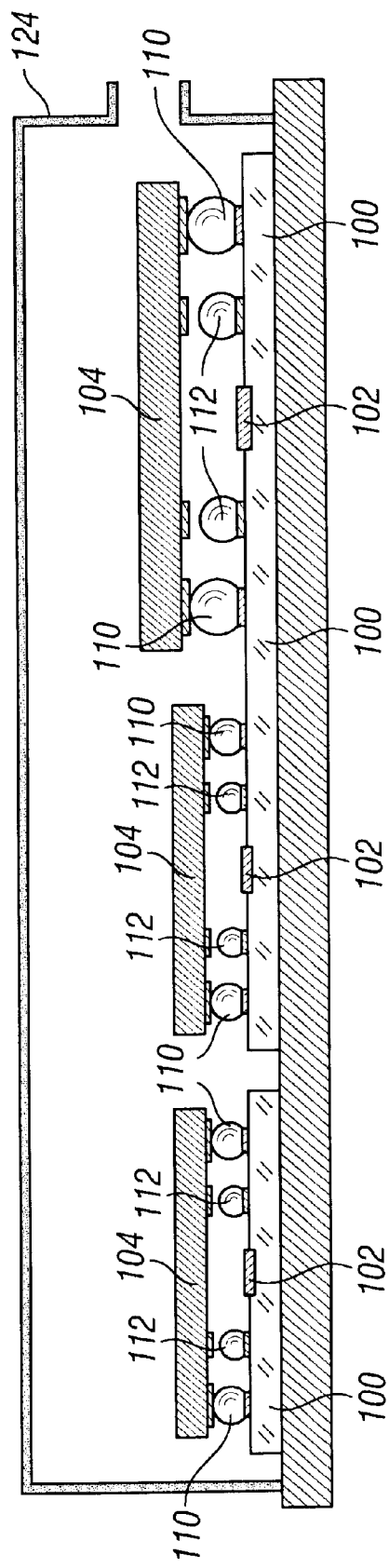
FIG. 10 is a cross-section diagram showing the treatment of a plurality of carriers, each associated with at least one cover, and showing the application of covers of different sizes on the same substrate.

However, as shown on the right side of FIG. 10, the invention advantageously applies to the application of a plurality of covers 104 of equal or different size on a substrate 100 comprising a plurality of identical or different components. These covers 104 may be added and positioned before the carrier 100 is placed in a chamber 124 with a controlled atmosphere. The chamber 124 may therefore be freed of positioning and aligning means for the covers.

In one particular example in which the component is a bolometer sensor, the cover may be in a transparent material, in particular transparent to infrared radiation.

In addition, the method of the invention is adapted to simultaneous treatment of a plurality of substrates 100 (FIG. 10).

Figure 8:
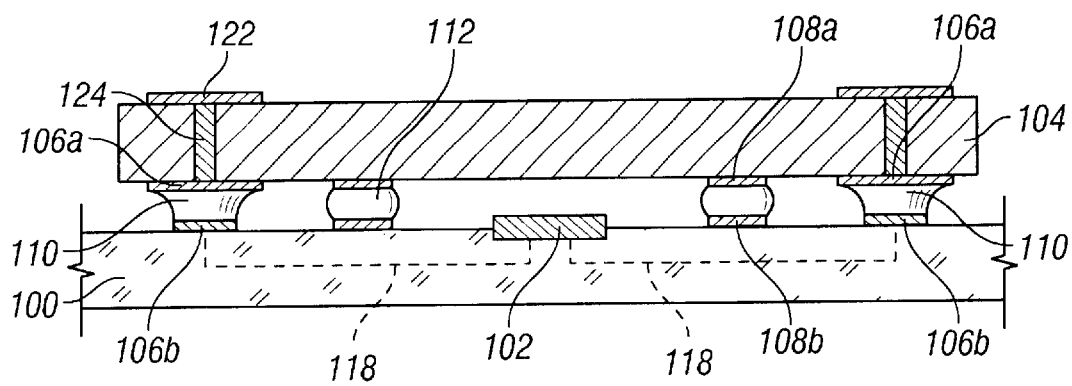
FIGS. 8 and 9 are also simplified cross-section diagrams of the substrate and the cover, and show possible uses of wedges in fusible material as an electrical connection.

FIG. 8 shows a device similar to the device in FIG. 7, in which the wedges 110, in an electric conductive fusible material, are used as electric connection elements between carrier 100 and cover 104.

Wedges 110 are formed on areas 106b made in a wettable material, that is also electric conductive, and are connected by electric connection means 118 to the components of carrier 100. In the example of FIG. 8, the connection areas are connected to the component 102.

Moreover, the electric conductive connection areas 106a of the cover, are connected to external contact pads 122 flush with a free upper surface of the cover. The electric link between the connection areas 106a and pads 122 is ensured by metallized pathways 124, or "vias" crossing the cover.

The external contact pads 122 may therefore be used as supply terminals for the carrier components or as inlet/outlet data terminals.

Figure 9:
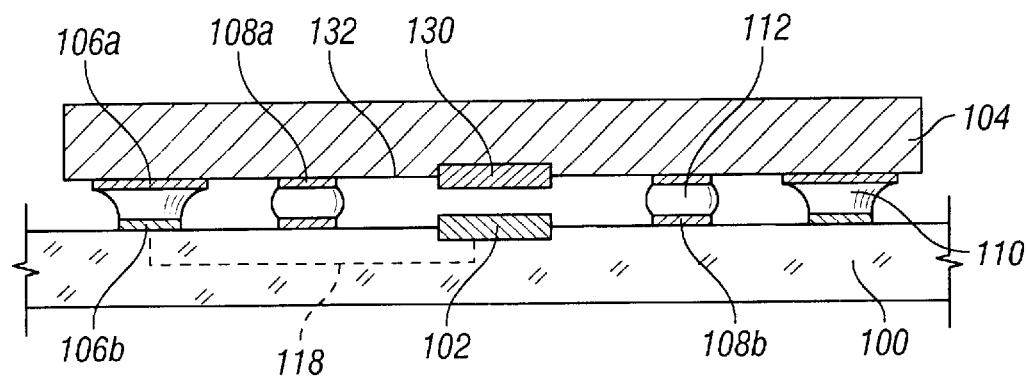

As a variant, FIG. 9 shows another possible embodiment of the device in which the wedges of fusible material are used to connect the components located on the carrier with components located on the cover.

In the example of the figure, component 102 of the carrier is connected to another component 130 located on the surface of the cover oriented towards carrier 100. The connection is successively ensured by an internal link 118, a carrier connection area 106b, a wedge 110, a cover connection area 106a and a metallic layer 132 deposited on the surface of the cover oriented towards the carrier.

Cited Documents (1) L. Ristic, "Sensor technology and Device", pages 207–215. Published by: ARTECH HOUSE—Boston—London.
(2) M. Esashi and K. Minami, "Packaged Micromechanical Semiconductor", pages 30–37, 1994, IEEE Symposium on Emerging Technologies & Factory Automation.
(3) R. Tummala, "Microelectronic Packaging Handbook", pages 736–755, published by: VAN NOSTRAND REINHOLD.

What is claimed is:

1. A method for encapsulating in a controlled atmosphere at least one component (102) by bonding at least one cover (104) onto at least one region of a carrier (100) containing the component, the method comprising:

providing at least one of either the cover or the carrier with bonding means (112) surrounding a region corresponding to said component, and with at least one wedge (110) in a fusible material;

mutually positioning the cover and the substrate in an ambient atmosphere, such that the cover is placed substantially opposite a region corresponding to the component; and heating the assembly formed by the cover and the carrier in a chamber with a controlled atmosphere at a temperature that is sufficient to melt the wedge of fusible material, wherein the wedge of fusible material (110) is made with an initial height before melting that is sufficient to prevent the bonding means (112) from joining in impervious manner the cover to the carrier, and with a height after melting that is sufficiently low to enable impervious contact of the bonding means (112) both with the cover and the carrier, and wherein said wedge allows said region to retain said controlled atmosphere after said heating.

2. Method according to claim 1, in which the bonding means (112) comprise a strip of fusible material able to melt during heating.

3. Method according to claim 2, in which the strip of fusible material has an initial height before fusion that is lower than the initial height of the wedge of fusible material, and a height after fusion called hybridisation height, that is greater than the hybridisation height of the wedge.

4. Method according to claim 3, in which the cover and the carrier are provided with areas (106a, 106b, 108a, 108b) to receive the fusible material, in a material that is wettable by the fusible material.

5. Method according to claim 1, in which the fusible material is chosen from among AuSn, SnPb, CuSn.

6. A method for encapsulating in a controlled atmosphere at least one component (102) by bonding at least two covers (104) onto at least two regions of a carrier (100) containing the component, the method comprising:

providing, for each component, at least one of either the cover or the carrier with bonding means (112) surrounding a region corresponding to said component, and with at least one wedge (110) in a fusible material;

mutually positioning, for each component, the cover and the substrate in an ambient atmosphere, such that the cover is placed substantially opposite a region corresponding to the component;

heating the assembly formed by the covers and the carrier in a chamber with a controlled atmosphere at a temperature that is sufficient to melt the wedge of fusible material, wherein the wedge of fusible material (110) is made with an initial height before melting that is sufficient to prevent the bonding means (112) from joining in impervious manner the covers to the carrier, and with a height after melting that is sufficiently low to enable impervious contact of the bonding means (112) both with the covers and the carrier, wherein said wedge allows said region to retain said controlled atmosphere after said melting.

7. Method according to claim 1, in which the component is an electronic component.

8. Method according to claim 1, in which the component is a bolometer detector, and in which the cover is in a material transparent to infrared radiation.

9. Method according to claim 1, in which a plurality of carriers are simultaneously treated each associated with at least one cover.

* * * * *